US007012240B2

(12) United States Patent
Yaung

(10) Patent No.: US 7,012,240 B2
(45) Date of Patent: Mar. 14, 2006

(54) IMAGE SENSOR WITH GUARD RINGS AND METHOD FOR FORMING THE SAME

(75) Inventor: Dun-Nian Yaung, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 272 days.

(21) Appl. No.: 10/729,406

(22) Filed: Dec. 5, 2003

(65) Prior Publication Data
US 2005/0040317 A1    Feb. 24, 2005

Related U.S. Application Data

(60) Provisional application No. 60/496,997, filed on Aug. 21, 2003.

(51) Int. Cl.
*H01J 40/14*   (2006.01)
*H01L 21/441*  (2006.01)

(52) U.S. Cl. .............................. 250/214.1; 250/208.1; 257/432

(58) Field of Classification Search ............. 250/208.1, 250/214.1; 257/231, 291, 294, 432; 438/319, 438/411, 422, 428, 619
See application file for complete search history.

(56) References Cited

U.S. PATENT DOCUMENTS

| | | | | |
|---|---|---|---|---|
| 5,880,018 | A  | *  | 3/1999  | Boeck et al. ............... 438/619 |
| 6,465,861 | B1 | *  | 10/2002 | Liu et al. .................... 257/444 |
| 2002/0182631 | A1 | * | 12/2002 | Schurmann-Mader et al. . 435/6 |
| 2004/0097065 | A1 | * | 5/2004  | Lur et al. .................... 438/619 |
| 2004/0151014 | A1 | * | 8/2004  | Speakman .................... 365/49 |
| 2004/0157165 | A1 | * | 8/2004  | Oh .............................. 430/313 |

* cited by examiner

*Primary Examiner*—Stephone B. Allen
(74) *Attorney, Agent, or Firm*—Thomas, Kayden, Horstemeyer & Risley

(57) ABSTRACT

An image sensor with air gaps as optical guard rings is provided. The air gaps are formed in a stacked insulating layer between the sensor areas, that is, around each pixel. A light transmitting insulating layer is formed on the stacked insulating layer without filling the air gaps.

20 Claims, 6 Drawing Sheets

IMAGE SENSOR WITH GUARD RINGS AND METHOD FOR FORMING THE SAME

CROSS-REFERENCE TO RELATED APPLICATION

This application claims the benefit of U.S. Provisional Application Ser. No. 60/496,997, filed Aug. 21, 2003, and of U.S. Provisional Application filed under Expression Mail No. ER499787510US, on Nov. 20, 2003.

BACKGROUND OF THE INVENTION

1. Field of the Invention

This invention relates generally to an image sensor. In particular, it relates to an image sensor with optical guard rings to prevent cross-talk between adjacent pixels.

2. Description of the Related Art

Solid state image sensors are necessary components in many optoelectronic devices, including digital cameras, cellular phones, and toys. Conventional solid-state image sensors for color analog or digital video cameras are typically charge-coupled device (CCD) or complementary metal oxide semiconductor (CMOS) photodiode array structures which comprise a spectrally photosensitive layer below one or more layers patterned in an array of color filters and above which resides a surface-layer array of microlens elements. The elementary unit of the image sensor is defined as a pixel. The basic technology used to form the CMOS image sensor is common to both types sensors.

The CMOS image sensor comprises a photo detector for detecting light and a logic circuit for converting the detected light into an electric signal representing data regarding the detected light. The fill factor, sometimes referred to as the aperture efficiency, is the ratio of the size of the light-sensitive area to the size of the total pixel size. Although efforts have been made to increase the fill factor of the image sensor and thereby increase the sensor sensitivity, further increases in the fill factor are limited because the associated logic circuitry cannot be completely removed. Accordingly, in order to increase the sensitivity of the light, a microlens formation technology has been used to converge and focus the incident light onto the photo detector by changing the path of the light that reaches the lens of the photo detector. In order for the image sensor to detect and provide a color image, it typically must include both a photo detector for receiving the light and generating and accumulating charge carriers and a color filter array (CFA), i.e., a plurality of color filter units sequentially arranged above the photo detector. The CFA typically uses one of two alternative three-color primary configurations, either red R, green G and blue B (RGB) or yellow Y, magenta M and cyan C (CMY). A plurality of microlenses are positioned above the color filter array to increase the photosensitivity of the image sensor.

FIG. 1 shows a traditional image sensor disposed in the substrate. The incident light 30 may not effectively focus on the photodiode 12 and may transmit to the adjacent photodiode 12'. As the pixel size is shrunk and multi-layer metal is used to reduce sensor cost, the cross-talk issue is more serious due to light scattering coming from metal layers 16 and 20. Thus, image resolution is degraded, especially for black and white sensors, and color correction is more difficult for color sensors.

SUMMARY OF THE INVENTION

Accordingly, it is the object of this invention to provide an image sensor to prevent cross-talk from occurring between adjacent pixels.

To achieve the above objects, an image sensor with air gaps as optical guard rings is provided. The air gaps are formed in the stacked inter-metal dielectric layer between the sensor areas, and a light transmitting insulating layer is disposed on the stacked inter-metal dielectric layer without filling the air gaps. Therefore, the incident light cannot transmit to the adjacent pixel.

DETAILED DESCRIPTION OF THE INVENTION

Figure 1:
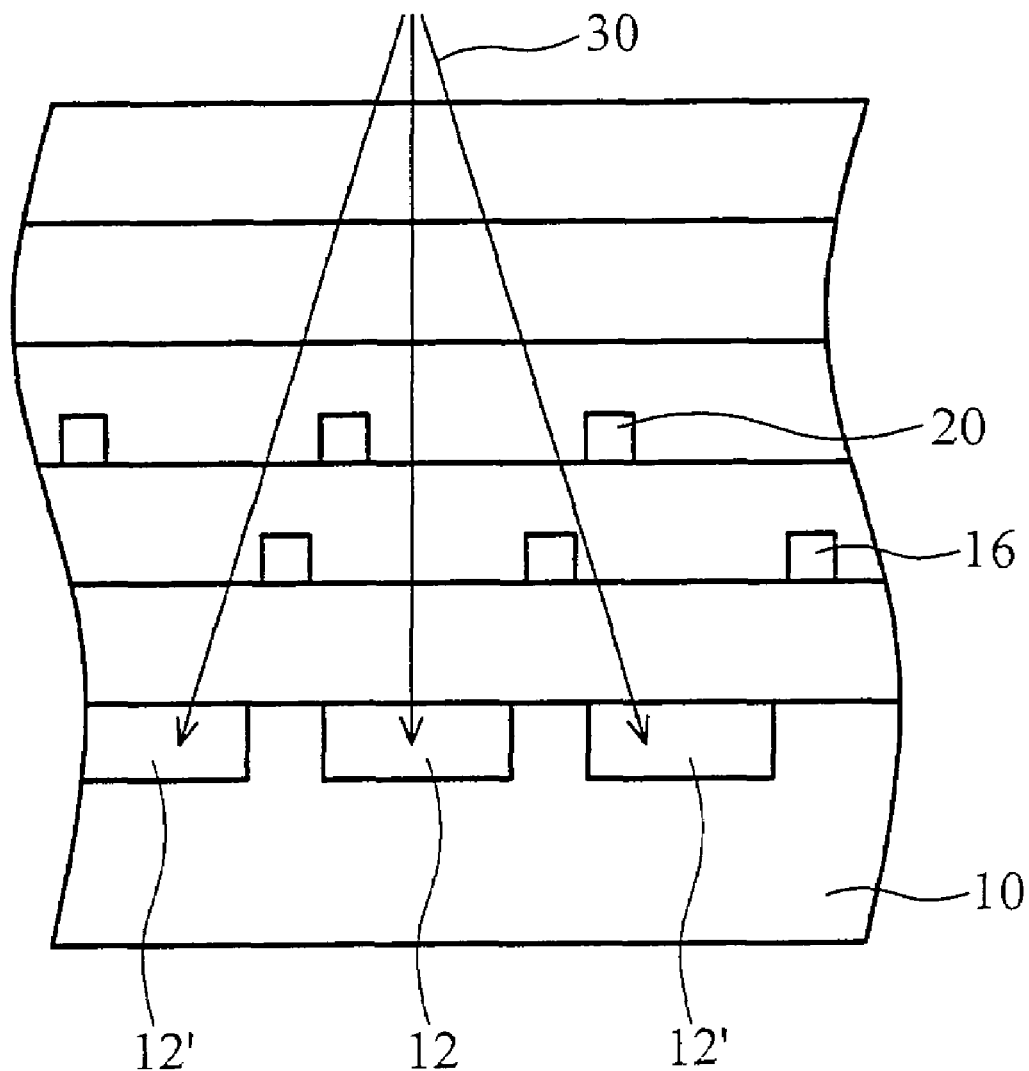
FIG. 1 shows a traditional image sensor disposed in the substrate.
Figure 2A:
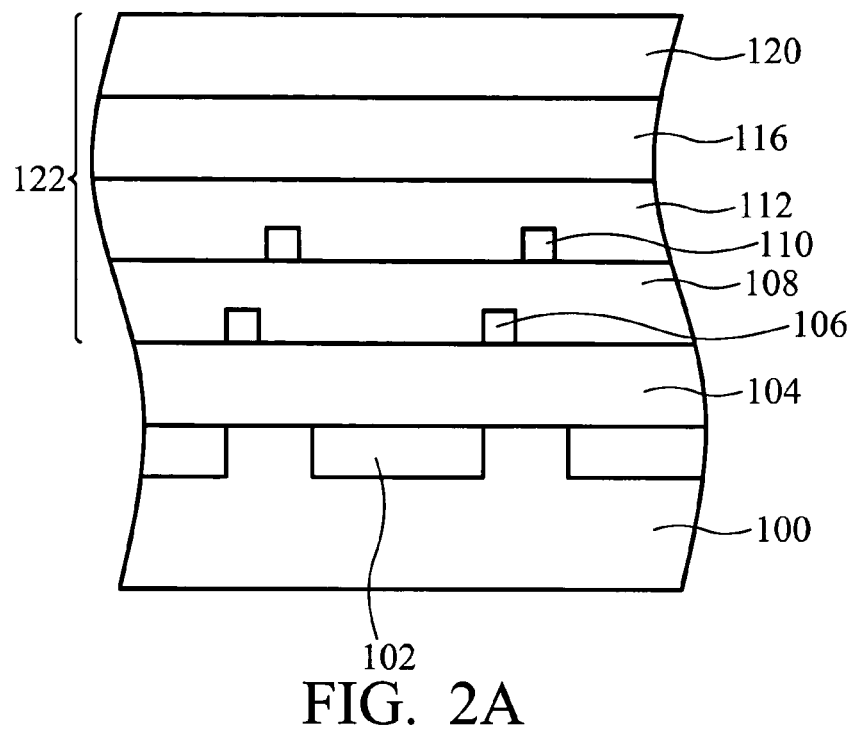
FIGS. 2A to 2C illustrate a method for fabricating an image sensor in accordance with the present invention.
Figure 2B:
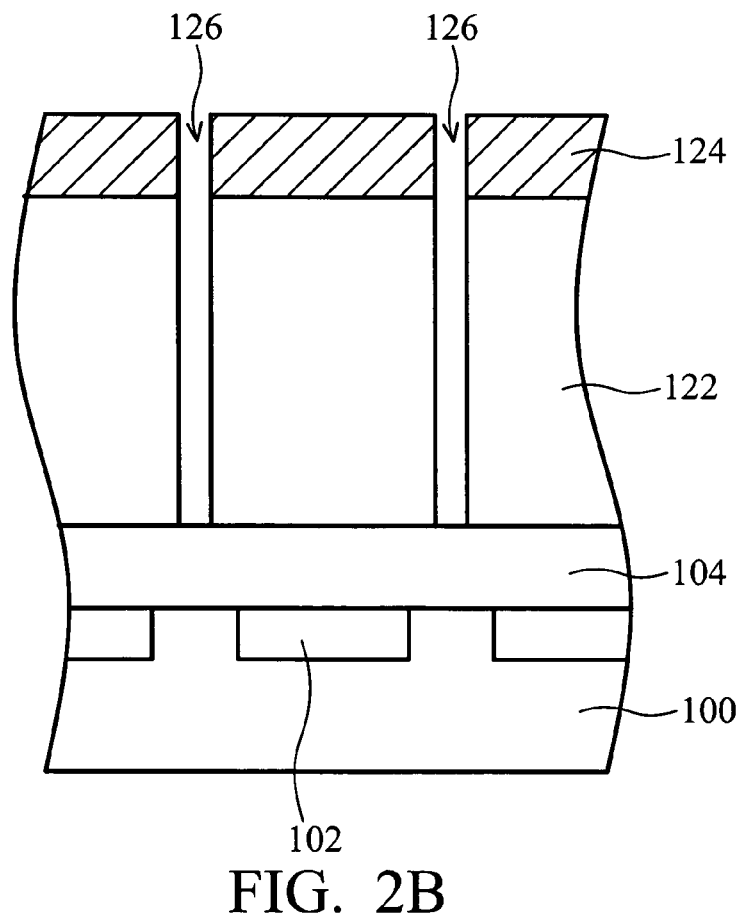
Figure 2C:
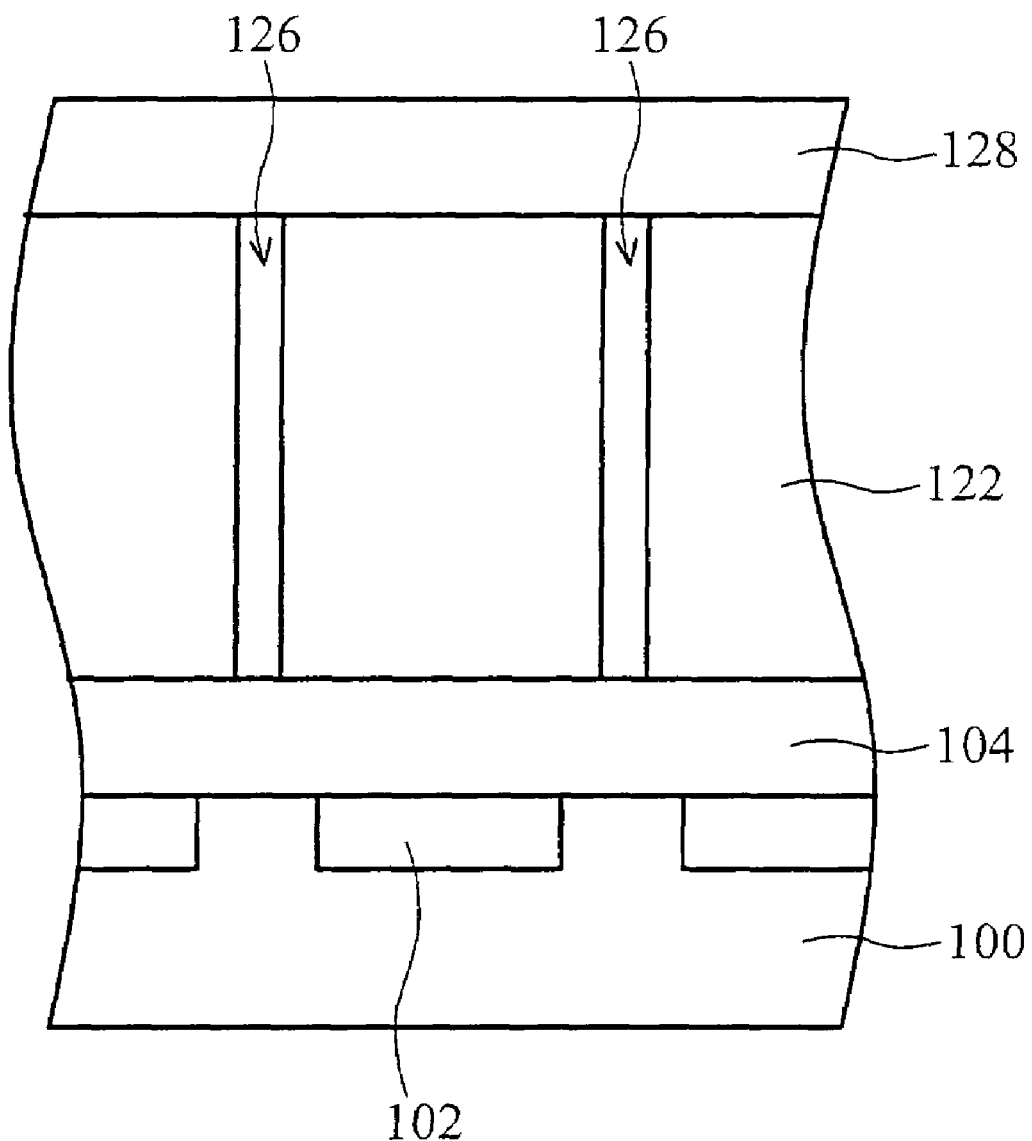

FIGS. 2A to 2C illustrate a method for fabricating an image sensor in accordance with the present invention by significantly modifying the conventional image sensor fabrication process using air gaps as optical guard rings.

As shown in FIG. 2A, a sensor area, such as a photodiode 102, is formed in a semiconductor substrate 100. Other elements, such as transistors (not shown), are also formed in or on the semiconductor substrate 100. An interlayer dielectric layer (ILD layer) 104, which is a light transmitting pre-metal dielectric layer, is formed on the semiconductor substrate 100 to cover those elements. A first metal layer is then deposited on the ILD layer 104 and selectively patterned to form a first metal line 106 on the ILD layer 104 except above the photodiode 102. After a first inter-metal dielectric layer 108, for insulating adjacent metal lines from each other, is deposited and planarized on the first metal line 106, a second metal layer is deposited on the first inter-metal dielectric layer 108 and selectively patterned and etched to generate a second metal line 110 positioned generally above the first metal line 106. A second inter-metal dielectric layer 112 for insulating the adjacent metal lines 110 from each other is deposited and planarized. The following interconnection process for forming the inter-metal dielectric layers 116 and 120 is then performed. In the figure, inter-metal dielectric layers 108, 112, 116 and 120 are shown as an exemplary embodiment. It is understood that more or fewer inter-metal dielectric layers could be used. Inter-metal dielectric layers 108, 112, 116 and 120 are shown as a stacked inter-metal dielectric layer 122 in the following FIGS. 2B–2C.

As shown in FIG. 2B, an energy sensitive layer, such as photoresist layer 124, is deposited on the stacked inter-metal dielectric layer 122 and patterned utilizing conventional photolithography process to form an optical guard ring pattern. The patterned photoresist layer 124 with the optical guard ring pattern is used as a mask for etching the stacked inter-metal dielectric layer 122, thereby forming air gaps 126 between pixels, that is, around each pixel boundary.

As shown in FIG. 2C, a light transmitting insulating layer 128 is formed on the stacked inter-metal dielectric layer 122 without filling the air gaps 126. The light transmitting insulating layer 128 is, for example, an oxide layer deposited by PECVD with a thickness of 3,500–10,500 $\mu$m and planarized by CMP.

Figure 3:
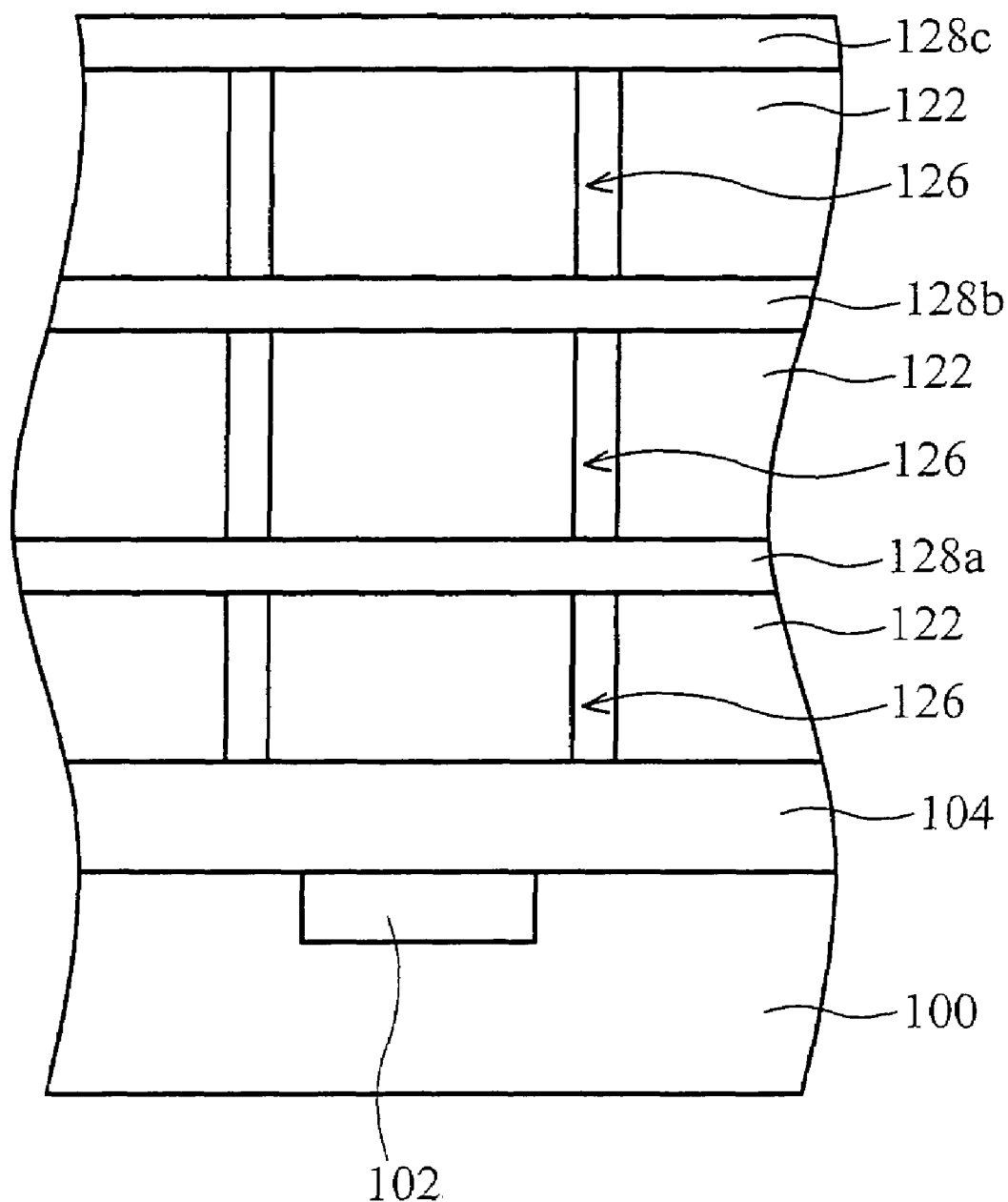
FIG. 3 shows an image sensor with air gaps formed by two or more etching processes and separated by light transmitting insulating layers.
Figure 4:
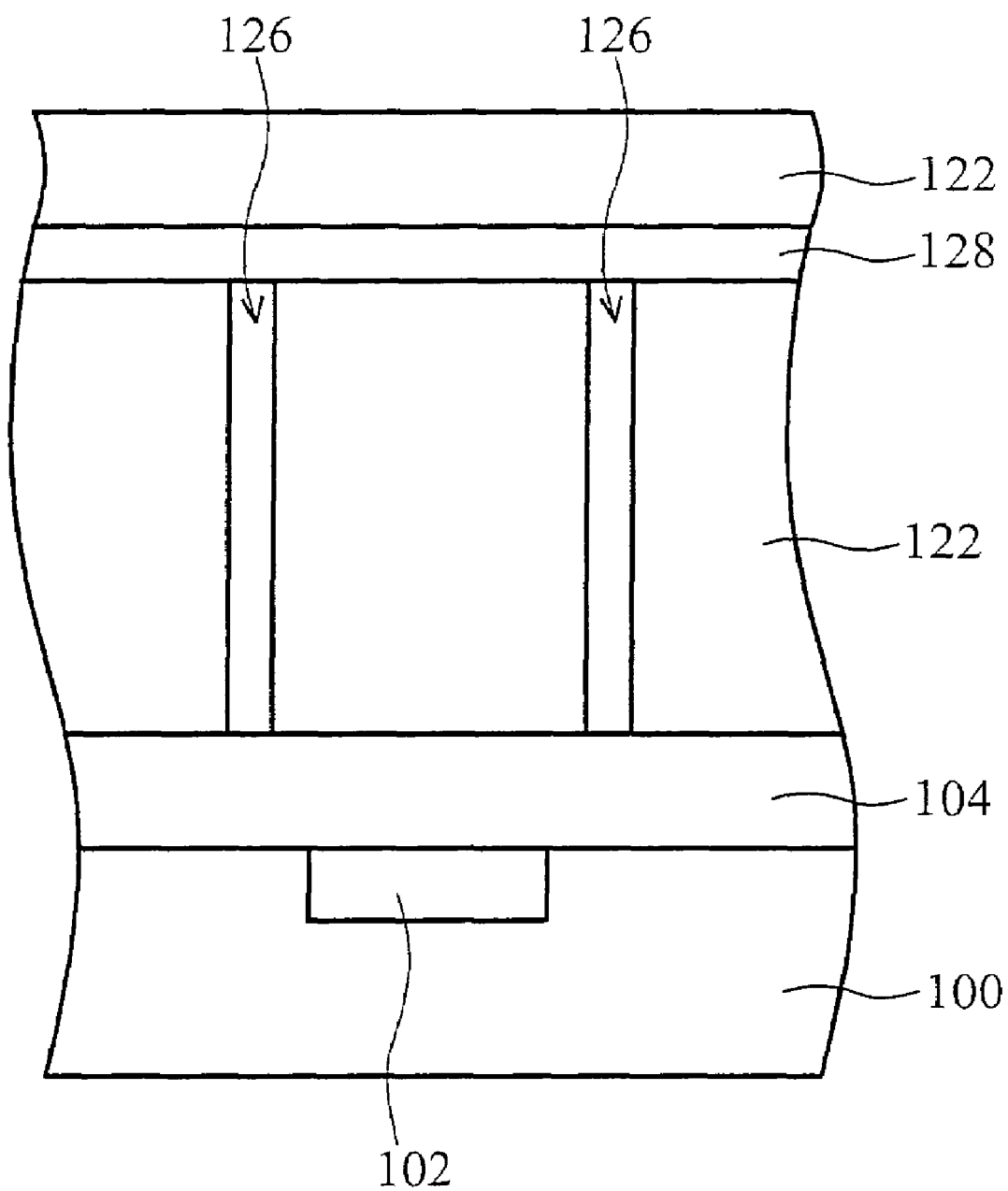
FIG. 4 shows an image sensor with air gaps in parts of the whole inter-metal dielectric layers.

The air gaps 126 may be formed in whole inter-metal dielectric layers, or in parts of the whole inter-metal dielectric layers. In the former, the air gaps 126 can be formed by one etching process (as shown in FIG. 2C), or formed by two or more etching process and separated by light transmitting insulating layers 128a, 128b and 128c without filling the air gaps 126 (as shown in FIG. 3). In the latter, after covering the light transmitting insulating layer 128 on the stacked inter-metal dielectric layer 122, the following interconnection process for forming another inter-metal dielectric layer 122 is then performed, as shown in FIG. 4.

The optical guard rings used to prevent cross-talk between adjacent pixels in the present invention have a smaller index of refraction, n=1, such as air or other materials with n=1. When incident light is transmitted to the solid image sensor with air gaps as optical guard rings, the incident light may be completely reflected between the air gaps and the stacked inter-metal dielectric layer with a total reflection angle of 45°.

Figure 5:
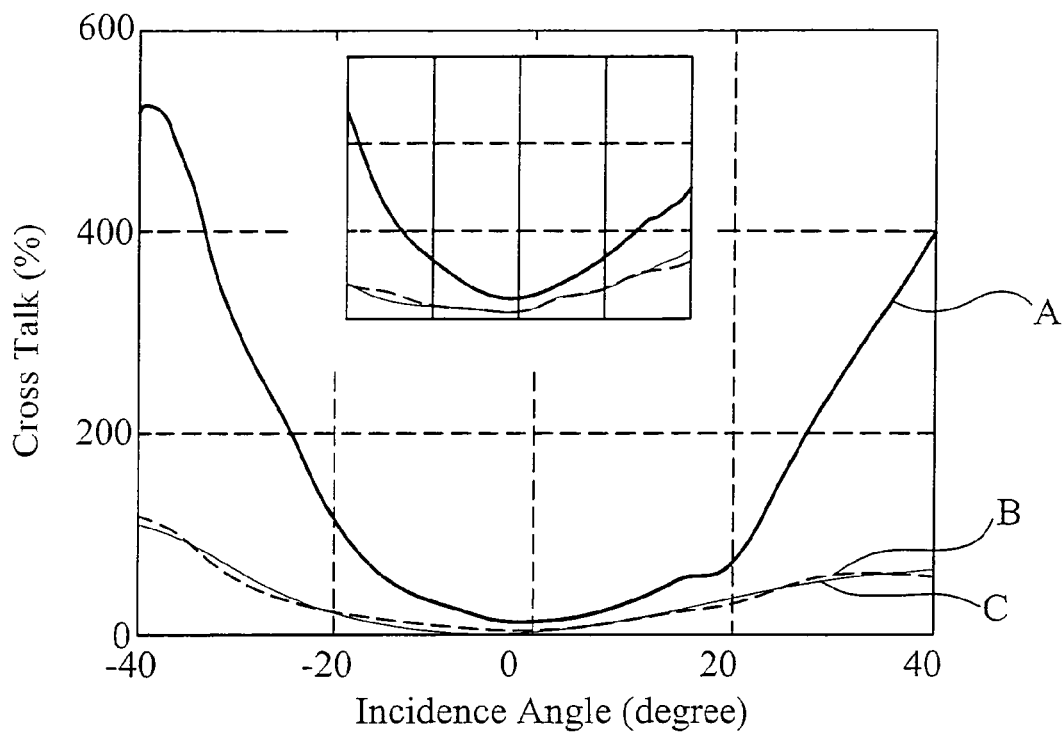
FIG. 5 shows the relationship between cross-talk and the incident angle of incident light occurring in the traditional image sensor without optical guard rings in the stacked inter-metal dielectric layer and the image sensor of the present invention with air gaps formed in the inter-metal dielectric layers as the optical guard rings.

FIG. 5 shows the relationships between the cross-talk and the incident angle of incident light occurring in the traditional image sensor without optical guard rings in the stacked inter-metal dielectric layer and the image sensor of the present invention with air gaps formed in the inter-metal dielectric layers as the optical guard rings. Cross talk is defined as the signal of metal-light-shield pixel (which corresponds to the sensor areas 102b shielded with metal M4) divided by non-shield pixel (which corresponds to the sensor area 102a).

Figure 6:
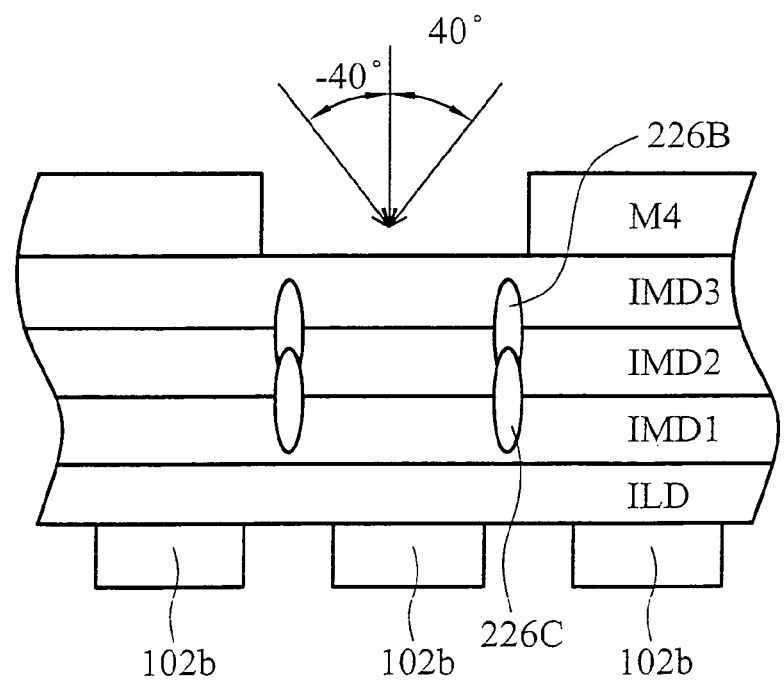
FIG. 6 shows the device designed to measure the cross talk for image sensors with or without air gaps as optical guard rings.

While there is no optical guard rings formed in the inter-metal dielectric layers IMD1, IMD2 and IMD3 as shown in FIG. 6, the relationship between the cross-talk and the incident angle of incident light is shown as line A in FIG. 5. While the air gaps 226B are formed in the inter-metal dielectric layers IMD2 and IMD3 as shown in FIG. 6, the relationship between the cross-talk and the incident angle of incident light is shown as line B in FIG. 5. While the air gaps 226C are formed in the inter-metal dielectric layers IMD1 and IMD2 as shown in FIG. 6, the relationship between the cross-talk and the incident angle of incident light is shown as line C in FIG. 5.

As can be seen in FIG. 5, the cross-talk problem is serious when incident angle becomes larger, especially −30°~−40° and 30°~40°, in the traditional image sensor. On the contrary, the cross-talk problem can be almost omitted in the image sensor with air gaps as optical guard rings.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An image sensor with optical guard rings, comprising:
   a substrate having a plurality of sensor areas;
   a stacked inter-metal dielectric layer disposed on the substrate;
   air gaps disposed in the stacked inter-metal dielectric layer between the sensor areas; and
   a light transmitting insulating layer disposed on the stacked inter-metal dielectric layer without filling the air gaps.

2. The image sensor with optical guard rings of claim 1, wherein the light transmitting insulating layer is a PECVD oxide layer.

3. The image sensor with optical guard rings of claim 1, further comprising an interlayer dielectric layer (ILD layer) disposed between the stacked inter-metal dielectric layer and the substrate.

4. The image sensor with optical guard rings of claim 1, further comprising another inter-metal dielectric layer disposed on the light transmitting insulating layer.

5. A device comprising an image sensor with optical guard rings of claim 1 embedded therein.

6. The device of claim 5, wherein the device is a cellular phone.

7. The device of claim 5, wherein the device is a digital camera.

8. The device of claim 5, wherein the device is a toy.

9. An image sensor with optical guard rings, comprising:
   a substrate having a plurality of sensor areas;
   a stacked inter-metal dielectric layer disposed on the substrate;
   optical guard rings with an index of refraction, n=1, disposed in the stacked inter-metal dielectric layer between the sensor areas; and
   a light transmitting insulating layer disposed on the stacked inter-metal dielectric layer and the optical guard rings.

10. The image sensor with optical guard rings of claim 9, wherein the optical guard rings are air gaps.

11. The image sensor with optical guard rings of claim 9, wherein the light transmitting insulating layer is a PECVD oxide layer.

12. The image sensor with optical guard rings of claim 9, further comprising an interlayer dielectric layer (ILD layer) disposed between the stacked inter-metal dielectric layer and the substrate.

13. The image sensor with optical guard rings of claim 9, further comprising another inter-metal dielectric layer disposed on the light transmitting insulating layer.

14. A device comprising an image sensor with optical guard rings of claim 9 embedded therein.

15. The device of claim 14, wherein the device is a cellular phone.

16. The device of claim 14, wherein the device is a digital camera.

17. The device of claim 14, wherein the device is a toy.

18. A method for forming an image sensor with optical guard rings, comprising:

providing a plurality of sensor areas in a substrate;
forming an interlayer dielectric layer on the substrate and the sensor areas;
forming a stacked inter-metal dielectric layer on the interlayer dielectric layer;
forming a plurality of gaps in the inter-metal dielectric layer around each pixel; and
forming a light transmitting insulating layer on the stacked inter-metal dielectric layer without filling the gaps.

19. The method for forming an image sensor with optical guard rings of claim 18, wherein the light transmitting insulating layer is formed by deposition with PECVD and planarization with CMP.

20. The method for forming an image sensor with optical guard rings of claim 18, further comprising forming another inter-metal dielectric layer on the light transmitting insulating layer.

* * * * *